(12) United States Patent
Kim et al.

(10) Patent No.: US 7,271,080 B2
(45) Date of Patent: Sep. 18, 2007

(54) ELECTRICALLY ERASABLE PROGRAMMABLE READ ONLY MEMORY (EEPROM) CELLS AND METHODS OF FABRICATING THE SAME

(75) Inventors: Young-Ho Kim, Ohsan-shi (KR); Ho-Bong Shin, Suwon-shi (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 66 days.

(21) Appl. No.: 11/328,790

(22) Filed: Jan. 10, 2006

(65) Prior Publication Data

US 2006/0108633 A1   May 25, 2006

Related U.S. Application Data

(62) Division of application No. 10/761,488, filed on Jan. 21, 2004, now Pat. No. 7,019,354.

(30) Foreign Application Priority Data

Jan. 24, 2003 (KR) ................. 2003-04802

(51) Int. Cl.
  *H01L 21/426* (2006.01)
  *H01L 21/308* (2006.01)
  *H01L 21/467* (2006.01)
(52) U.S. Cl. .................. 438/526; 438/704; 257/E21.68
(58) Field of Classification Search ................ 438/526, 438/704; 257/E21.68
  See application file for complete search history.

*Primary Examiner*—Andy Huynh
*Assistant Examiner*—Earl Taylor
(74) *Attorney, Agent, or Firm*—F. Chau & Associates, LLC

(57) ABSTRACT

Electrically erasable programmable read only memory (EEPROM) cells and methods of fabricating the same are provided. An EEPROM cell includes an isolation layer formed at a semiconductor substrate to define an active region. A source region, a buried N+ region and a drain region are serially disposed at the active region. A memory gate is disposed to cross-over the buried N+ region. A first channel region is formed between the source region and the buried N+ region. A tunnel region is located between the buried N+ region and the memory gate and self-aligned with the buried N+ region.

11 Claims, 8 Drawing Sheets

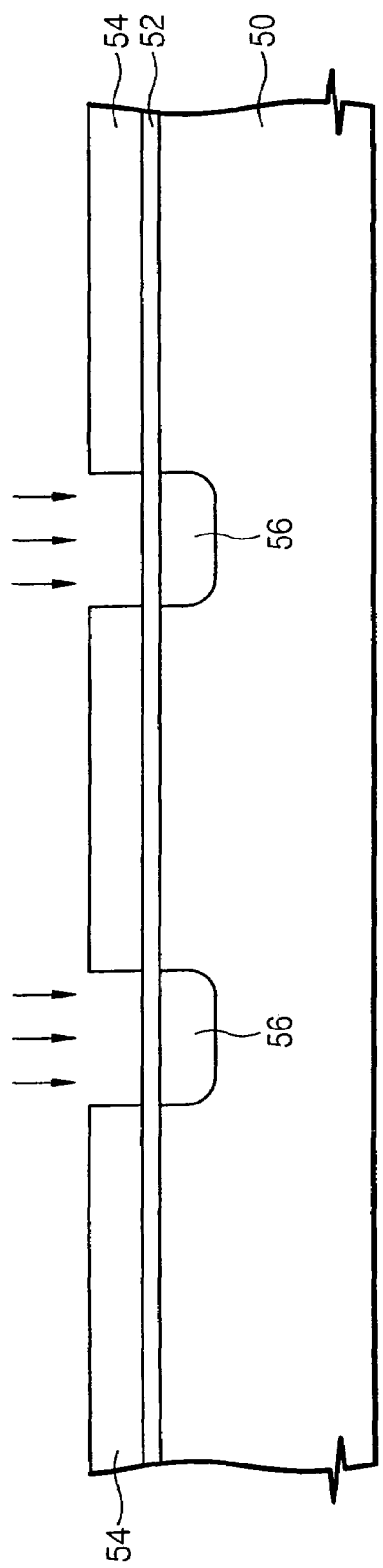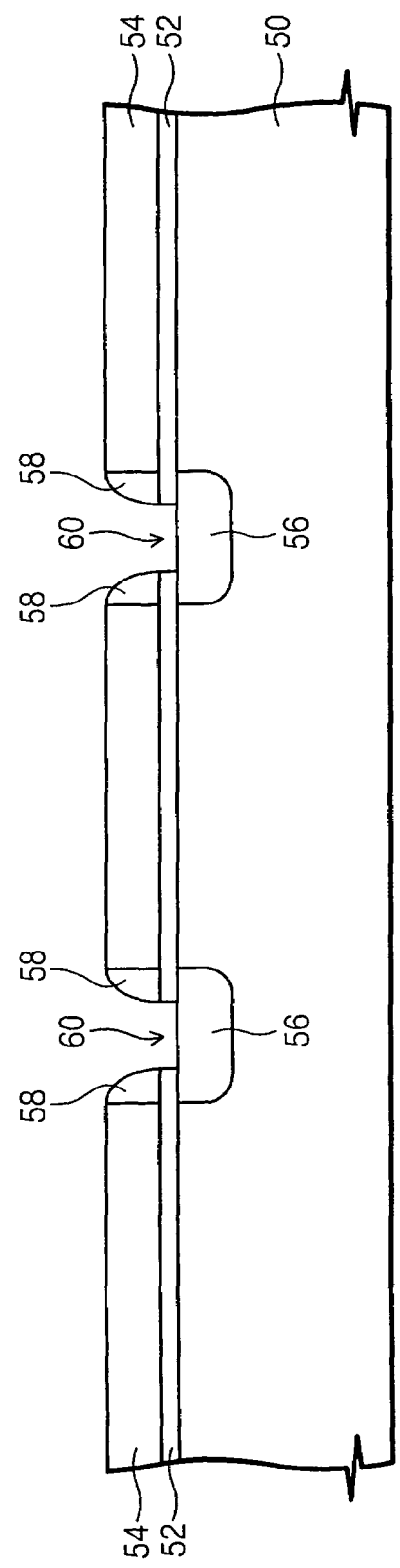

ELECTRICALLY ERASABLE PROGRAMMABLE READ ONLY MEMORY (EEPROM) CELLS AND METHODS OF FABRICATING THE SAME

CROSS-REFERENCE TO RELATED APPLICATIONS

This application is a Divisional of U.S. patent application Ser. No. 10/761,488 now U.S. Pat. No. 7,019,354 filed on Jan. 21, 2004, which is incorporated herein by reference and which claims priority to Korean Patent Application No. 2003-4802, filed on Jan. 24, 2003.

FIELD OF THE INVENTION

The present invention relates to semiconductor memory devices and methods of fabricating the same and, more particularly, to electrically erasable programmable read only memory (EEPROM) cells and methods of fabricating the same.

BACKGROUND

In general, EEPROM cells have floating gates similar to erasable programmable read only memory (EPROM) cells. Further, EEPROM cells and EPROM cells are programmed or erased by injecting electrons into the floating gates or ejecting the electrons out of the floating gates. However, mechanisms for injecting electrons and ejecting electrons of EEPROM cells are quite different from those of EPROM cells.

In an EPROM cell, channel hot electrons, which are accelerated from a source region toward a drain region, are injected into the floating gate during the programming operation, and the electrons stored in the floating gate are ejected by energy of ultra-violet (UV) light during the erasing operation. However, in an EEPROM cell, the programming operation and erasing operation are achieved by Fowler-Nordheim (FN) tunneling current that flows through a tunnel oxide layer under a high electric field of about 10 MV/cm.

Typically, a floating gate tunnel oxide (FLOTOX) based-type memory of EEPROM device has a unit cell composed of two transistors, e.g., a selection transistor for addressing a desired cell and a memory transistor for storing data. The memory transistor includes a floating gate where the data is stored, a control gate electrode for controlling the operation of the memory transistor, and an inter-gate dielectric layer interposed between the floating gate and the control gate electrode.

FIGS. 1 to 3 are cross sectional views illustrating a conventional method of fabricating an EEPROM cell.

Referring to FIG. 1, a first photoresist pattern 14 is formed on a semiconductor substrate 10. The photoresist pattern 14 is formed having an opening that exposes a predetermined region of the semiconductor substrate 10. Impurity ions are implanted into the semiconductor substrate 10 using the photoresist pattern 14 as an implantation mask, thereby forming a buried N+ region 16.

Referring to FIG. 2, the photoresist pattern 14 is removed, and a gate oxide layer 12 is formed on the semiconductor substrate where the photoresist pattern 14 is removed. A second photoresist pattern 15 is formed on the gate oxide layer 12. The second photoresist pattern 15 has an opening that exposes the gate oxide layer 12 on the buried N+ region 16. The gate oxide layer 12 is etched using the second photoresist pattern 15 as an etching mask, thereby exposing the buried N+ region 16 and defining a tunnel region 20 on the buried N+ region 16.

Referring to FIG. 3, the second photoresist pattern 15 is removed, and a tunnel oxide layer 22 is formed in the tunnel region 20. Subsequently, a memory gate 34 and a selection gate 36, which are spaced apart from each other, are formed on the substrate having the tunnel oxide layer 22. The memory gate 34 is formed having a floating gate 24a, an inter-gate dielectric layer 30a and a control gate electrode oxide layer, which are sequentially stacked over the tunnel region 20. The selection gate 36 is formed having a lower selection gate 24b, an inter-gate dielectric layer 30b and an upper selection gate 32b, which are sequentially stacked on the gate oxide layer 12. Though not shown in the figure, the lower selection gate 24b is electrically connected to the upper selection gate 32b. Impurity ions are then implanted into the semiconductor substrate 10 using the memory gate 34 and the selection gate 36 as implantation masks, thereby forming a cell depletion region 38 and source/drain regions 40 and 42.

According to the foregoing method, the buried N+ region 16 and the tunnel region 20 are defined by two separate and different photolithography steps. Accordingly, the tunnel region 20 may be misaligned with the buried N+ region 16 as shown in FIG. 4.

FIG. 4 is a cross sectional view illustrating a pair of FLOTOX-based EEPROM cells, which are formed to be symmetrical about a common source region 40 shared by a pair of EEPROM cells. Each of the pair of EEPROM cells has the same structure as shown in FIG. 3.

Referring to FIG. 4, the tunnel regions 20 may be shifted toward a single direction by a distance "a" due to the misalignment that occurs during the photolithography process for defining the tunnel regions 20. As the distance "a" increases, the overlap area between the tunnel oxide layer 22 and the buried N+ region 16 can be reduced, thereby significantly decreasing the program and erasure efficiency of EEPROM cells.

Therefore, there is a need for EEPROM cells having uniform overlap areas between the tunnel regions and the buried N+ regions throughout the substrate to improve program, erasure and read operations of EEPROM devices.

SUMMARY OF THE INVENTION

Provided are EEPROM cells and methods of fabricating an EEPROM cell. According to an exemplary embodiment of the present invention, an EEPROM cell includes an isolation layer formed at a predetermined region of a semiconductor substrate to define an active region. A source region, a buried N+ region and a drain region, which are separated from one another, are disposed in the active region along a direction parallel to the active region. A cell depletion region is located in the active region between the buried N+ region and the drain region. The cell depletion region is also connected to the buried N+ region. The active region between the source region and the buried N+ region corresponds to a first channel region, and the active region between the cell depletion region and the drain region corresponds to a second channel region. A memory gate is disposed over the first channel region and is extended to cover the buried N+ region. A tunnel region is interposed between the buried N+ region and the memory gate. The tunnel region is self-aligned with the buried n+ region. In other words, distances between the edges of the tunnel region and the buried N+ region are equal at every place.

According to an exemplary embodiment of the present invention, a method includes forming an isolation layer at a predetermined region of a semiconductor substrate to define an active region. A gate oxide layer is formed on the active region. A mask pattern is formed on the substrate having the gate oxide layer. The mask pattern has an opening that exposes a portion of the gate oxide layer. N-type impurity ions are implanted into the active region using the mask pattern as an ion implantation mask, thereby forming a buried N+ region in the active region. A spacer pattern is formed on a sidewall of the opening. The spacer pattern defines a tunnel region. The gate oxide layer in the tunnel region is etched using the spacer pattern and the mask pattern as etching masks, thereby exposing the semiconductor substrate in the tunnel region. The mask pattern and the spacer pattern are removed, and a tunnel oxide layer is formed on the exposed semiconductor substrate in the tunnel region. A memory gate and a selection gate, which are spaced apart from each other, are formed on the substrate having the tunnel oxide layer. The memory gate is formed to cover the buried N+ region.

According to another exemplary embodiment of the present invention, a method of fabricating a self-aligned tunnel region in an electrically erasable programmable read only memory (EEPROM) cell is disclosed. The method comprises forming a gate oxide layer on an active region of a semiconductor substrate, forming a mask pattern having predetermined areas that expose a portion of the gate oxide layer, implanting impurity ions into the active region using the mask pattern as an ion implantation mask to form the buried N+ region, conformally forming a spacer insulating layer on the semiconductor substrate having the buried N+ region, anisotropically etching the spacer layer to form spacer patterns on sidewalls of the predetermined areas to define tunnel regions above the buried N+ region, etching the gate oxide layer using the mask pattern and the spacer patterns as etching masks to expose the buried N+ region in the tunnel regions, removing the mask pattern and the spacer pattern, and forming a tunnel oxide layer on the exposed buried N+ regions.

Thus, EEPROM cells having uniform overlap areas between the tunnel regions and the buried N+ regions throughout the substrate to improve program, erasure and read operations of EEPROM devices, and methods for forming EEPROM cells are disclosed.

These and other exemplary embodiments, features, aspects, and advantages of the present invention will be described and become apparent from the following detailed description of the exemplary embodiments when read in conjunction with the accompanying drawings.

BRIEF DESCRIPTION OF THE DRAWINGS

FIGS. 7 to 11 are cross sectional views illustrating methods of fabricating EEPROM cells according to exemplary embodiments of the present invention.

DETAILED DESCRIPTION OF EXEMPLARY EMBODIMENTS

Figure 1:
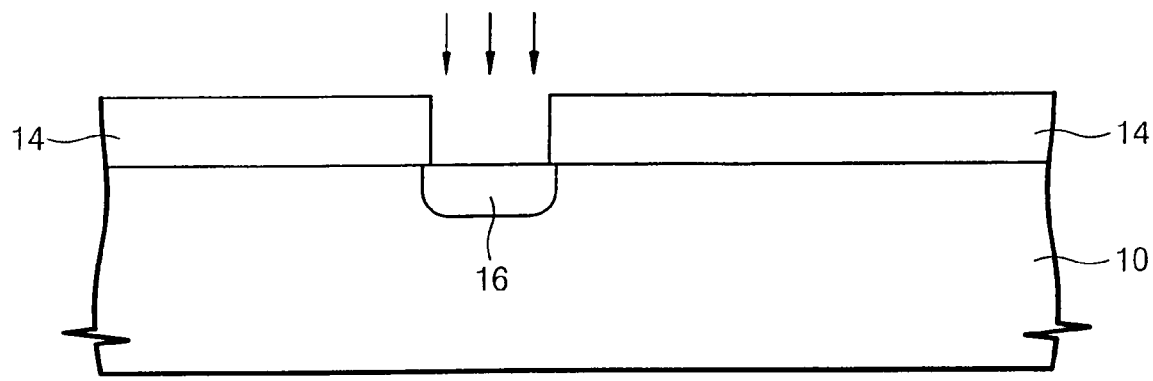
FIGS. 1 to 3 are cross sectional views illustrating a conventional method of fabricating an EEPROM cell.
Figure 2:
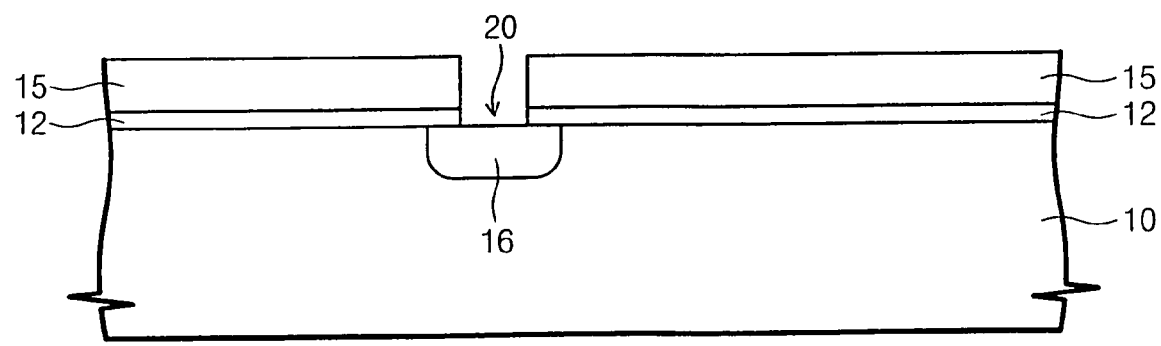
Figure 3:
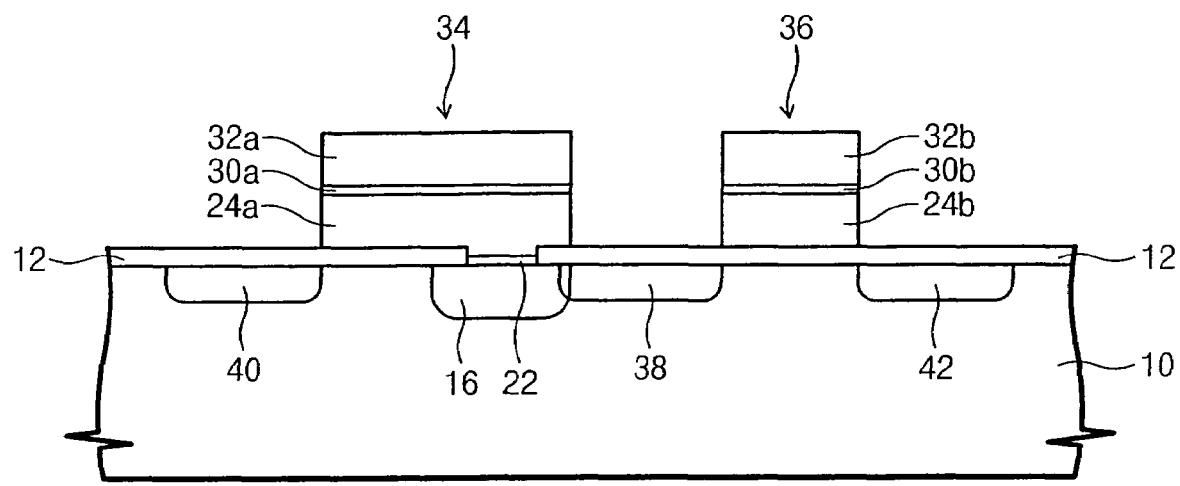
Figure 4:
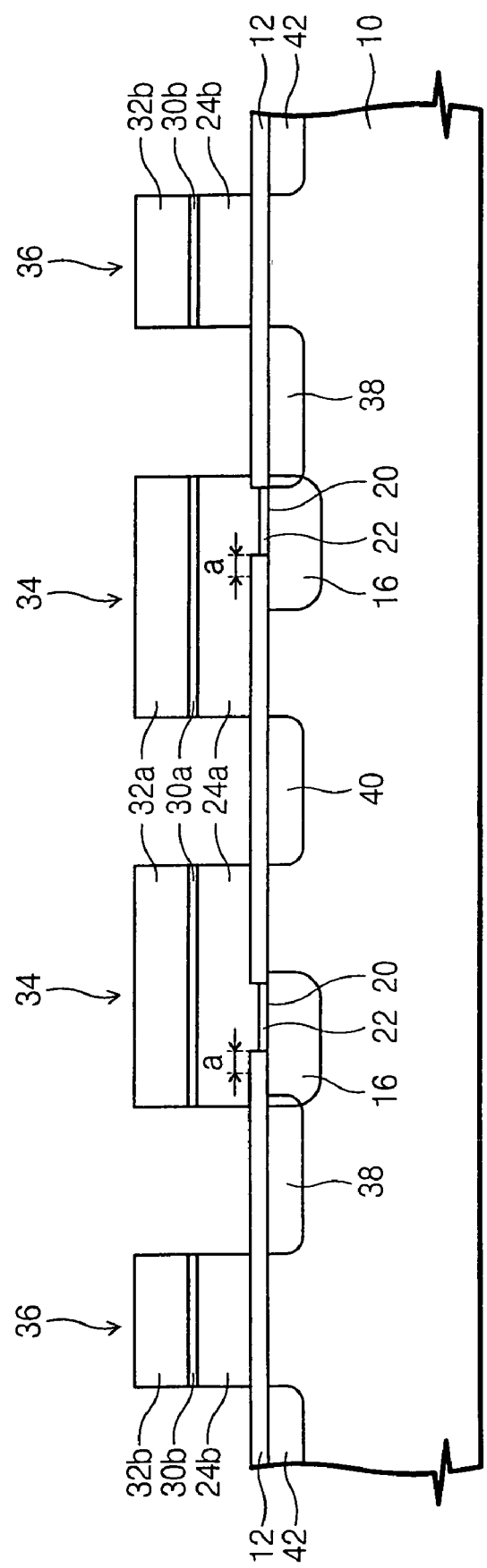
FIG. 4 is a cross sectional view illustrating a disadvantage of the conventional method as described in FIGS. 1 to 3.

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification.

Figure 5:
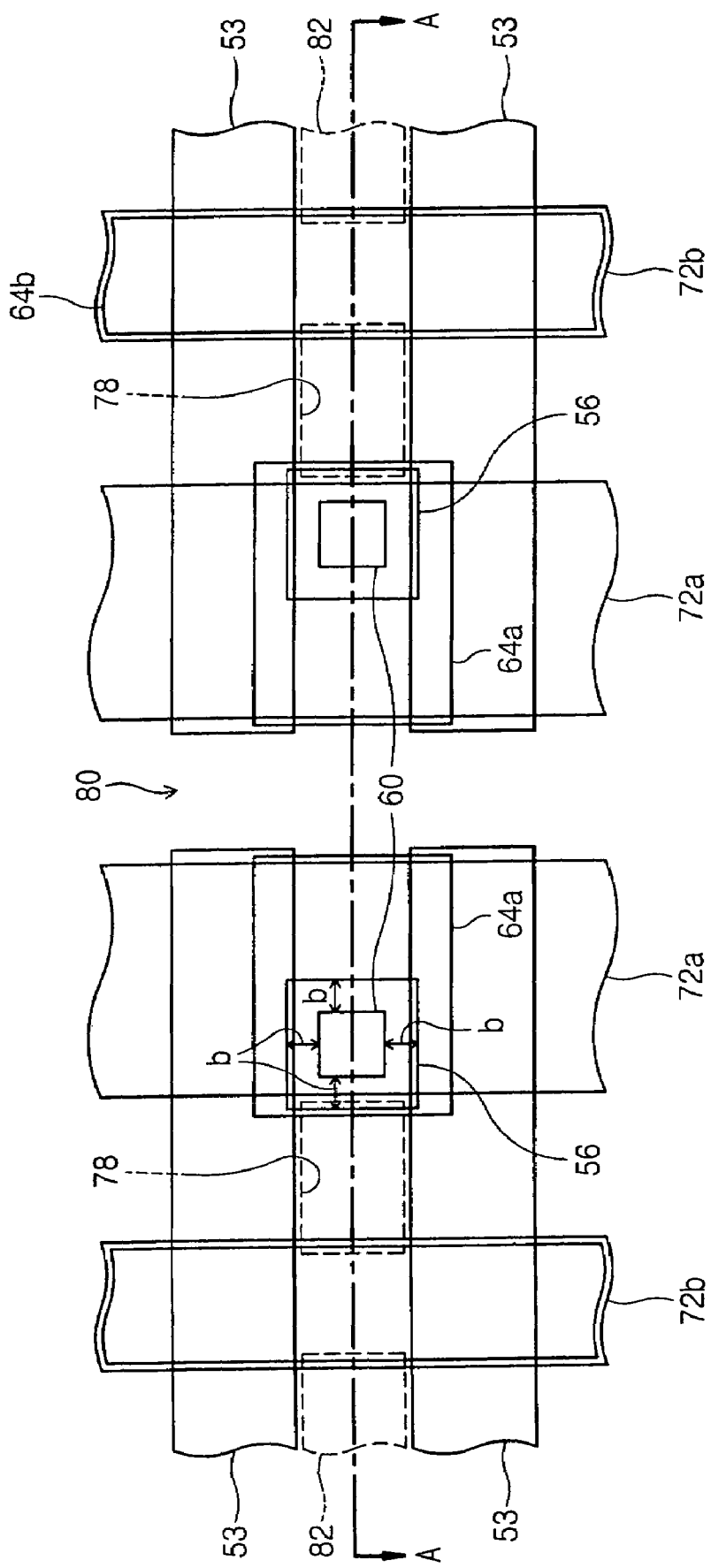
FIG. 5 is a top plan view illustrating EEPROM cells according to an exemplary embodiment of the present invention.
Figure 6:
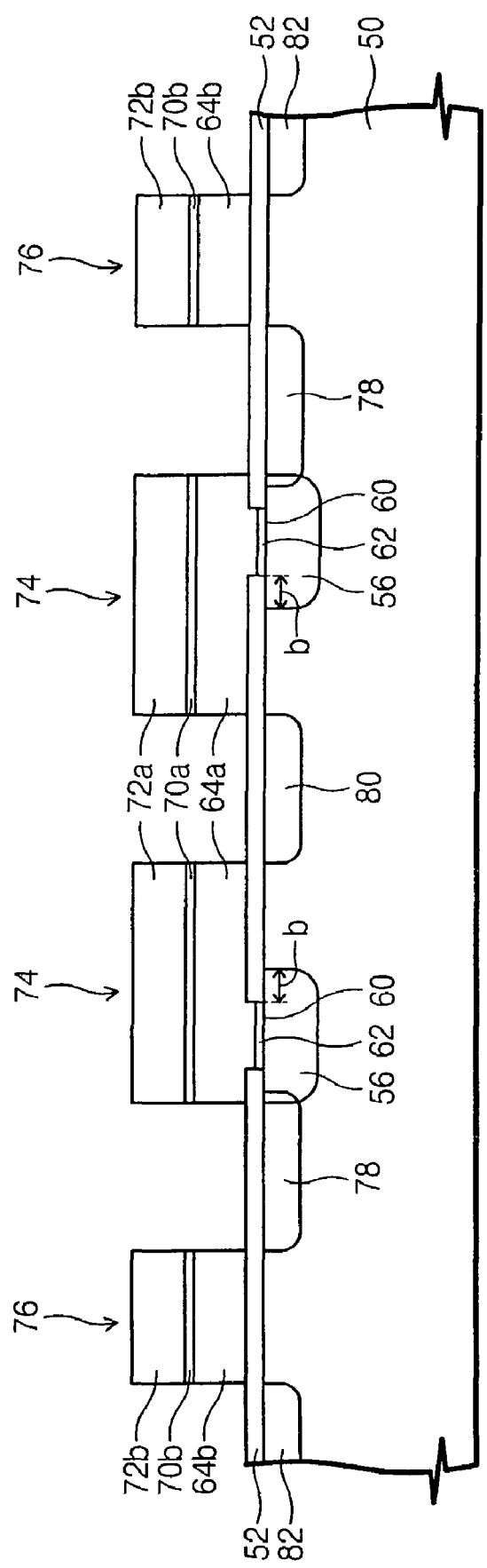
FIG. 6 is a cross sectional view taken along the line A-A of FIG. 5.

FIG. 5 is a top plan view a pair of EEPROM cells according to an exemplary embodiment of the present invention, and FIG. 6 is a cross sectional view taken along the line A-A of FIG. 5.

Referring to FIGS. 5 and 6, an isolation layer 53 is disposed at a predetermined region of a semiconductor substrate 50 to define an active region. A pair of memory gates 74 are disposed to cross over the active region. Each of the memory gates 74 includes a floating gate 64a, an inter-gate dielectric layer 70a and a control gate electrode 72a, which are sequentially stacked. A source region 80 is formed at the active region between the pair of memory gates 74. The active region between the pair of memory gates 74 may be extended to be parallel to the memory gated 74 as shown in FIG. 5. In this case, the source region 80 may have a line configuration. A pair of cell depletion regions 78 are formed at the active regions, which are adjacent to the memory gates 74 and are located on opposite the source region 80. A gate oxide layer 52 is interposed between the memory gates 74 and the semiconductor substrate 50. A pair of buried N+ regions 56 are disposed at the active regions, which are in contact with the cell depletion regions 78, and spaced apart from the source region 80. Thus, the memory gates 74 are disposed to cross over the buried N+ regions 56 and are extended to cover first channel regions between the buried N+ regions 56 and the source region 80.

Tunnel regions 60 are located between the memory gates 74 and the buried N+ regions 56. A tunnel oxide layer 62 is disposed in each of the tunnel regions 60. The tunnel regions 60 are self-aligned with the buried N+ regions 56, and the buried N+ regions 56 are wider than the tunnel regions 60. In other words, distances "b" between the edges of the tunnel regions 60 and the buried N+ regions 56 are equal at every place. The memory gate 74, the source region 80 and the buried n+ region 56 under the memory gate 74 comprise a memory transistor. Thus, a pair of memory transistors are disposed at the active region and are symmetrically disposed about the source region 80.

A pair of selection gates 76 are disposed to cross over the active region and are adjacent to the cell depletion regions 78. Each of the selection gates 76 includes a lower selection gate 64b, an inter-gate dielectric layer 70b and an upper selection gate 72b, which are sequentially stacked. Though not shown in the figure, the lower selection gates 64b can be electrically connected to the upper selection gates 72b through contact holes (for example, butted contact holes) that penetrate the inter-gate dielectric layer 70b. A pair of drain regions 82 are formed at the active regions adjacent a side of the selection gates 76 opposite the side where the cell depletion regions 78 are disposed. Thus, the selection gates 76 are disposed to cross over second channel regions between the drain regions 82 and the cell depletion regions 78. The gate oxide layer 52 is also interposed between the selection gates 76 and the second channel regions.

The drain region 82, the selection gate 76 adjacent to the drain region 82 and the cell depletion region 78 adjacent to the selection gate 76 comprise a selection transistor. Therefore, a pair of selection transistors are disposed to be adjacent to the memory transistors. The single memory transistor and the single selection transistor, which are adjacent to each other, comprise a single EEPROM cell. Thus, a pair of EEPROM cells, which are symmetrically disposed about the source region 80, are disposed at the active region.

FIGS. 7 to 11 are cross sectional views, taken along the line A-A of FIG. 5, illustrating methods of fabricating EEPROM cells according to exemplary embodiments of the present invention.

Referring to FIG. 7, an isolation layer (53 of FIG. 5) is formed at a predetermined region of a semiconductor substrate 50 to define an active region. A gate oxide layer 52 is formed on the active region. The gate oxide layer 52 may be formed having a thickness in a range of about 250 angstrom to about 350 angstrom. A mask pattern 54 is formed on the substrate having the gate oxide layer 52. The mask pattern 54 is formed having openings that expose predetermined portions of the gate oxide layer 52. N-type impurity ions are implanted into the active region using the mask pattern 54 as an ion implantation mask, thereby forming a pair of buried N+ regions 56.

Referring to FIG. 8, a spacer insulating layer is conformably formed on the substrate having the buried N+ regions 56. The spacer insulating layer is anisotropically etched to form spacer patterns 58 on sidewalls of the openings. The spacer patterns 58 define tunnel regions 60 on the buried N+ regions 56. Thus, the tunnel regions 60 are self-aligned with the buried N+ regions 56. The mask pattern 54 and the spacer patterns 58 are preferably formed of a material having an etch selectivity with respect to the gate oxide layer 52. For example, the mask pattern 54 and the spacer patterns 58 may be formed of a silicon nitride layer. The gate oxide layer 52 is then etched using the mask pattern 54 and the spacer patterns 58 as etching masks, thereby exposing the buried N+ regions 56 in the tunnel regions 60. The gate oxide layer 52 in the tunnel region 60 may be etched using a wet etching technique.

Figure 9:
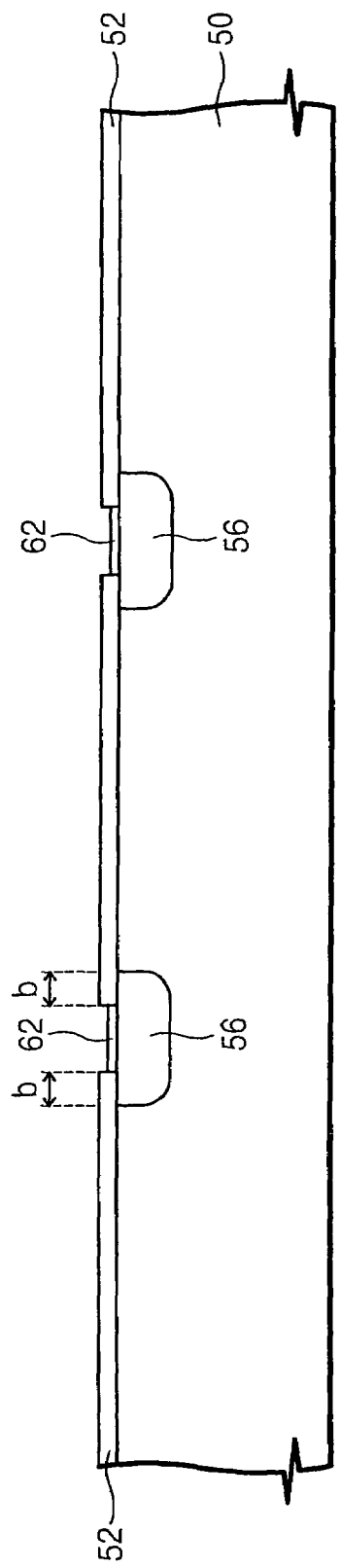

Referring to FIG. 9, the mask pattern 54 and the spacer patterns 58 are removed. The mask pattern 54 and the spacer patterns 58 may be removed using a wet etching technique. Thus, edges of the tunnel regions 60 are self-aligned with edges of the buried N+ regions 56 as described above. In other words, distances "b" between the edges of the tunnel regions 60 and the buried N+ regions 56 are equal at every place, thereby preventing the tunnel regions 60 from being misaligned with the buried N+ regions 56. In addition, the distances "b" may depend on the width of the spacer patterns 58.

A tunnel oxide layer 62 is formed on the buried N+ regions in the tunnel regions 60. The tunnel oxide layer 62 may be formed using a thermal oxidation technique. In this case, the tunnel oxide layer 62 can be formed with two different steps of thermal oxidation to reduce an interface trap density between the tunnel oxide layer 62 and the buried N+ regions 56. Further, the thermal oxidation process may include a first thermal oxidation process performed using an oxygen gas as an ambient gas, and a second thermal oxidation process performed using a NO gas or a $N_2O$ gas as an ambient gas. In particular, nitrogen atoms of the NO gas or the $N_2O$ gas passivate the interfaces between the initial tunnel oxide layer and the buried N+ regions 56 during the second thermal process, thereby reducing the interface trap density between the tunnel oxide layer 62 and the buried N+ regions 56.

Figure 10:
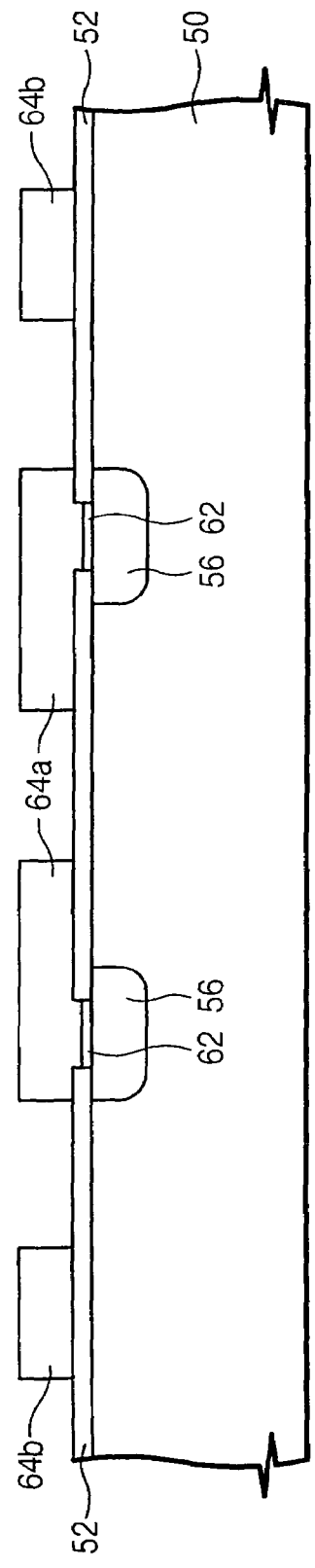

Referring to FIG. 10, floating gate patterns 64a and lower selection gates 64b are formed on the substrate having the tunnel oxide layer 62. The floating gate patterns 64a and the lower selection gates 64b can be formed using conventional techniques. More specifically, the floating gate patterns 64a are formed to cover the buried N+ regions 56 and are extended to overlap with the active regions adjacent to the N+ regions 56. Also, both ends of the respective floating gate patterns 64a may overlap the isolation layer (53 of FIG. 5) adjacent to the active regions. In addition, the lower selection gates 64b are formed to cross over the active regions and the isolation layer 53 therebetween.

Figure 11:
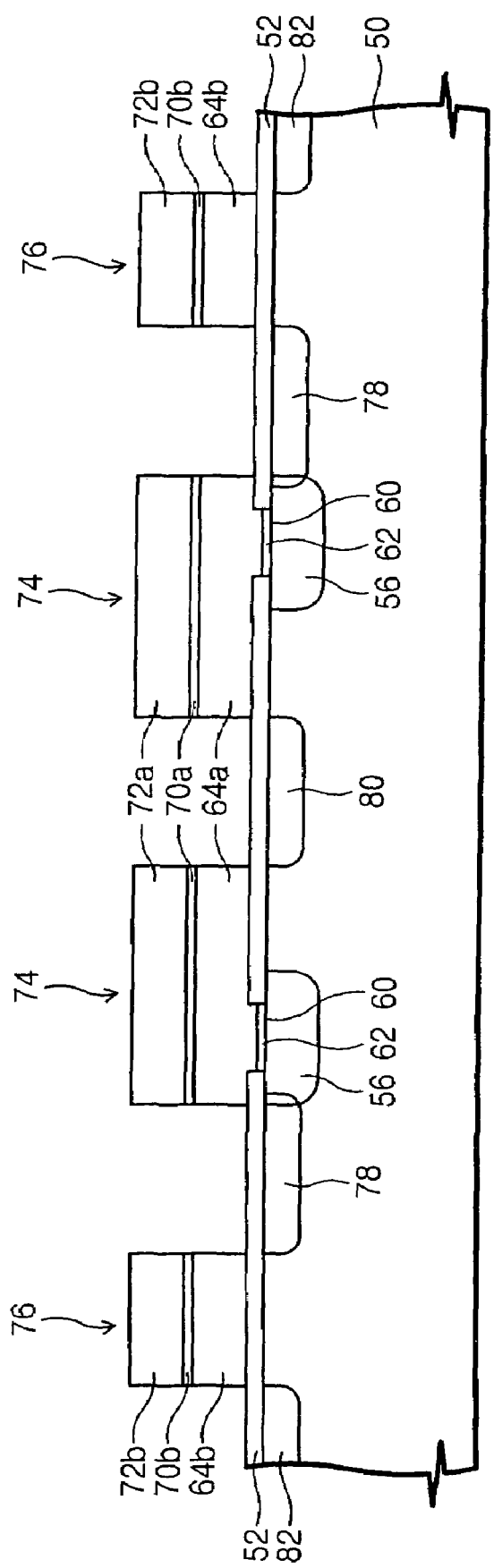

Referring to FIG. 11, control gate electrodes 72a are formed to cross over the floating gate patterns 64a, and upper selection gates 72b are formed to stacked over the lower selection gates 64b. Thus, the control gate electrodes 72a and the upper selection gates 72b are formed to be parallel to each other. An inter-gate dielectric layer 70a is interposed between the floating gate patterns 64a and the control gate electrodes 72a. In addition, an inter-gate dielectric layer 70b is interposed between the lower selection gates 64b and the upper selection gates 72b.

The inter-gate dielectric layer 72b may be etched to expose a predetermined region of the respective lower selection gates 64b prior to the formation of the upper selection gates 72b. Thus, each of the upper selection gates 72b is electrically connected to the lower selection gate 64b thereunder. Alternatively, the upper selection gates 72b can be electrically connected to the lower selection gates 64b using a conventional butted contact technique.

According to the exemplary embodiments of the present invention as described above, the tunnel regions are self-aligned with the buried N+ regions. Thus, it is possible to obtain uniform overlap areas between the tunnel regions and the buried N+ regions throughout the substrate, thereby improving the program, erasure and read operations of EEPROM devices.

What is claimed is:

1. A method of fabricating an electrically erasable programmable read only memory (EEPROM) cell, comprising the steps of:

forming an isolation layer on a semiconductor substrate to define an active region;

forming a gate oxide layer on the active region;

forming a mask pattern on the gate oxide layer, the mask pattern having an opening that exposes a portion of the gate oxide layer;

implanting impurity ions into the active region using the mask pattern as an ion implantation mask, thereby forming a buried N+ region in the active region;

forming a spacer pattern on a sidewall of the opening to define a tunnel region surrounded by the spacer pattern;

etching the gate oxide layer in the tunnel region using the mask pattern and the spacer pattern as etching masks, thereby exposing the buried N+ region;

removing the mask pattern and the spacer pattern;

forming a tunnel oxide layer on the buried N+ region in the tunnel region; and simultaneously forming a memory gate over the buried N+ region and a selection gate spaced apart from the memory gate.

2. The method of claim 1, further comprising implanting impurity ions into the semiconductor substrate using the memory gate and the selection gate as ion implantation masks, thereby forming a source region, a cell depletion region and a drain region, wherein the cell depletion region is formed at the active region between the memory gate and the selection gate to connect with the buried N+ region, the source region is formed to be adjacent to the memory gate and opposite the cell depletion region, and the drain region is formed to be adjacent to the selection gate and opposite the cell depletion region.

3. The method of claim 1, wherein the mask pattern and the spacer pattern are formed of a silicon nitride layer.

4. The method of claim 1, wherein etching the gate oxide layer in the tunnel region is performed using a wet etching technique.

5. The method of claim 1, wherein forming the tunnel oxide layer comprises the steps of:
oxidizing the substrate using an oxygen gas as an ambient gas; and
oxidizing the substrate using a NO gas or a $N_2O$ gas as an ambient gas.

6. A method of fabricating a self-aligned tunnel region in an electrically erasable programmable read only memory (EEPROM) cell, comprising the steps of:
forming a gate oxide layer on an active region of a semiconductor substrate;
forming a mask pattern having predetermined areas that expose portions of the gate oxide layer;
implanting impurity ions into the active region using the mask pattern as an ion implantation mask to form buried N+ regions;
conformally forming a spacer insulating layer on the semiconductor substrate having the buried N+ regions;
anisotropically etching the spacer insulating layer to form spacer patterns on sidewalls of the predetermined areas to define tunnel regions above the buried N+ regions;
etching the gate oxide layer using the mask pattern and the spacer patterns as etching masks to expose the buried N+ region in the tunnel regions;
removing the mask pattern and the spacer pattern; and
forming a tunnel oxide layer on the exposed buried N+ regions in the tunnel regions.

7. The method of claim 6, wherein the mask pattern and the spacer pattern are formed of a silicon nitride layer.

8. The method of claim 6, wherein etching the gate oxide layer in the tunnel region is performed using a wet etching technique.

9. The method of claim 6, wherein forming the tunnel oxide layer comprises the steps of:
oxidizing the substrate using an oxygen gas as an ambient gas; and
oxidizing the substrate using a NO gas or a $N_2O$ gas as an ambient gas.

10. The method of claim 6, further comprising simultaneously forming a memory gate over the buried N+ region and a selection gate spaced apart from the memory gate.

11. The method of claim 10, further comprising implanting impurity ions into the semiconductor substrate using the memory gate and the selection gate as ion implantation masks, thereby forming a source region, a cell depletion region and a drain region, wherein the cell depletion region is formed at the active region between the memory gate and the selection gate to connect with the buried N+ region, the source region is formed to be adjacent to the memory gate and opposite the cell depletion region, and the drain region is formed to be adjacent to the selection gate and opposite the cell depletion region.

* * * * *